United States Patent [19]
Li et al.

[11] Patent Number: 5,142,285
[45] Date of Patent: Aug. 25, 1992

[54] ACOUSTO-OPTIC THETA MODULATION-BASED ANALOG-TO-DIGITAL CONVERTER

[75] Inventors: Yao Li; Yan Zhang, both of New York, N.Y.

[73] Assignees: City College of New York; Hamamatsu Photonics K.K., Shizuoka, Japan

[21] Appl. No.: 654,471

[22] Filed: Feb. 13, 1991

[51] Int. Cl.$^5$ .................... H03M 1/00; H03K 13/02
[52] U.S. Cl. ..................... 341/137; 359/305
[58] Field of Search ............ 341/137; 350/358; 359/285, 305, 311

[56] References Cited

U.S. PATENT DOCUMENTS

| | | | |
|---|---|---|---|
| 3,572,899 | 3/1971 | Bell, Jr. .................. | 350/358 |
| 3,641,564 | 2/1972 | Fasset et al. ............. | 341/137 |
| 4,395,702 | 7/1983 | Gottlieb et al. ........... | 341/137 |
| 4,502,037 | 2/1985 | Le Parquier et al. ....... | 341/137 |
| 4,847,796 | 7/1989 | Aleksoff et al. .......... | 350/358 |
| 4,851,840 | 7/1989 | McAulay ................... | 341/137 |
| 4,960,322 | 10/1990 | Khoshnevisan et al. ...... | 350/358 |
| 4,974,943 | 12/1990 | Noguchi ................... | 350/358 |

FOREIGN PATENT DOCUMENTS 54-133362  10/1979  Japan ....................... 341/137

*Primary Examiner*—Howard L. Williams
*Attorney, Agent, or Firm*—Finnegan, Henderson, Farabow, Garrett and Dunner

[57] ABSTRACT

An optical theta-modulation based analog-to-digital converter having an acousto-optic deflector and an analog-to-digital conversion mask, for fast and flexible analog-to-digital conversion. The acousto-optic deflector deflects an optical beam at an angle corresponding to an input voltage signal having an analog value. The analog-to-digital conversion mask converts the deflected optical beam into N masked optical signals which each corresponds to a respective bit of a digital value representing the analog value of the input signal. Each optical signal is detected by a photodetector and converted into an output voltage signal by a comparator.

5 Claims, 4 Drawing Sheets

BINARY CODE b3 b2 b1 b0

GRAY CODE g3 g2 g1 g0

ACOUSTO-OPTIC THETA MODULATION-BASED ANALOG-TO-DIGITAL CONVERTER

BACKGROUND OF THE INVENTION

1. Field of the Invention

This invention relates to high precision numerical data processing, and more particularly to high speed optical analog-to-digital conversion.

2. Background of the Invention

For high precision numerical data processing, digital (rather than analog) computation is preferred. To increase the data processing rate, both fast signal processing and fast analog-to-digital (A/D) conversion are required. Optical A/D conversion has been investigated as an alternative to semiconductor or superconductor based A/D conversion. Wide-band, fast optical A/D conversion based on electro-optic (E-O) waveguide interferometric devices has been proposed. Recently, optical A/D conversion based on an optical logic gate array and an optical table look-up processor has been proposed.

Optical A/D conversion based on an optical theta-modulation and table look-up (TMTL) has also been proposed. The concept of using TMTL for signal processing has been known for decades, and the TMTL concept has been implemented by deflecting an electron-beam between deflection plates in an oscilloscope. When used in a video display, the resultant device could reach over 1000 resolvable levels.

The TMTL concept has also been implemented by an optical theta-modulation based on a variable grating mode (VGM) liquid-crystal (LC) device for optical signal processing. Such a VGM LC has also been proposed for the optical implementation of optical logic and signal processors. However, such a device has serious problems, such as a limited dynamic range and a limited switching time, which have inhibited high speed applications.

SUMMARY OF THE INVENTION

An object of the present invention is to overcome the problems and disadvantages of the prior art by an optical theta-modulation and table look-up (TMTL) based analog-to-digital (A/D) converter having an acousto-optical (A-O) deflector.

Another object of the present invention is to provide an optical analog-to-digital conversion system wherein an input voltage can be substantially identically mapped into a beam deflection angle.

A further object of the present invention is to provide an optical analog-to-digital conversion system having a wide bandwidth and a fast processing rate.

Still another object of the present invention is to provide an optical analog-to-digital conversion system that performs real-time optical theta-modulation.

Another object of the present invention is a reliable optical analog-to-digital conversion system.

To achieve these and other objects and in accordance with the purpose of the invention, as embodied and broadly described herein, the optical analog-to-digital conversion system of the present invention comprises input signal source means for providing an input voltage signal having an analog value; light source means for generating an optical beam; acousto-optic (A/D) deflector means, coupled to the input signal source means and the light source means, for deflecting the optical beam at an angle corresponding to the analog value of the input voltage signal; an analog-to-digital conversion mask means, coupled to the acousto-optic deflector, for converting the deflected optical beam into N masked optical signals where N is an integer greater than unity and represents the number of bits of a digital value corresponding to the analog value; and detection means, coupled to the analog-to-digital conversion mask means, for detecting the N masked optical signals and converting each detected N masked optical signal into an output voltage signal corresponding to a respective bit of the digital value.

The accompanying drawings, which are incorporated in and constitute a part of this specification, illustrate an embodiment of the present invention and together with the description, serve to explain the principles of the invention.

DESCRIPTION OF THE PREFERRED EMBODIMENT

Reference will now be made in detail to the present preferred embodiment of the invention, an example of which is illustrated in the accompany drawings. Wherever possible, the same reference numbers will be used throughout the drawings to refer to the same or like parts.

Figure 1:
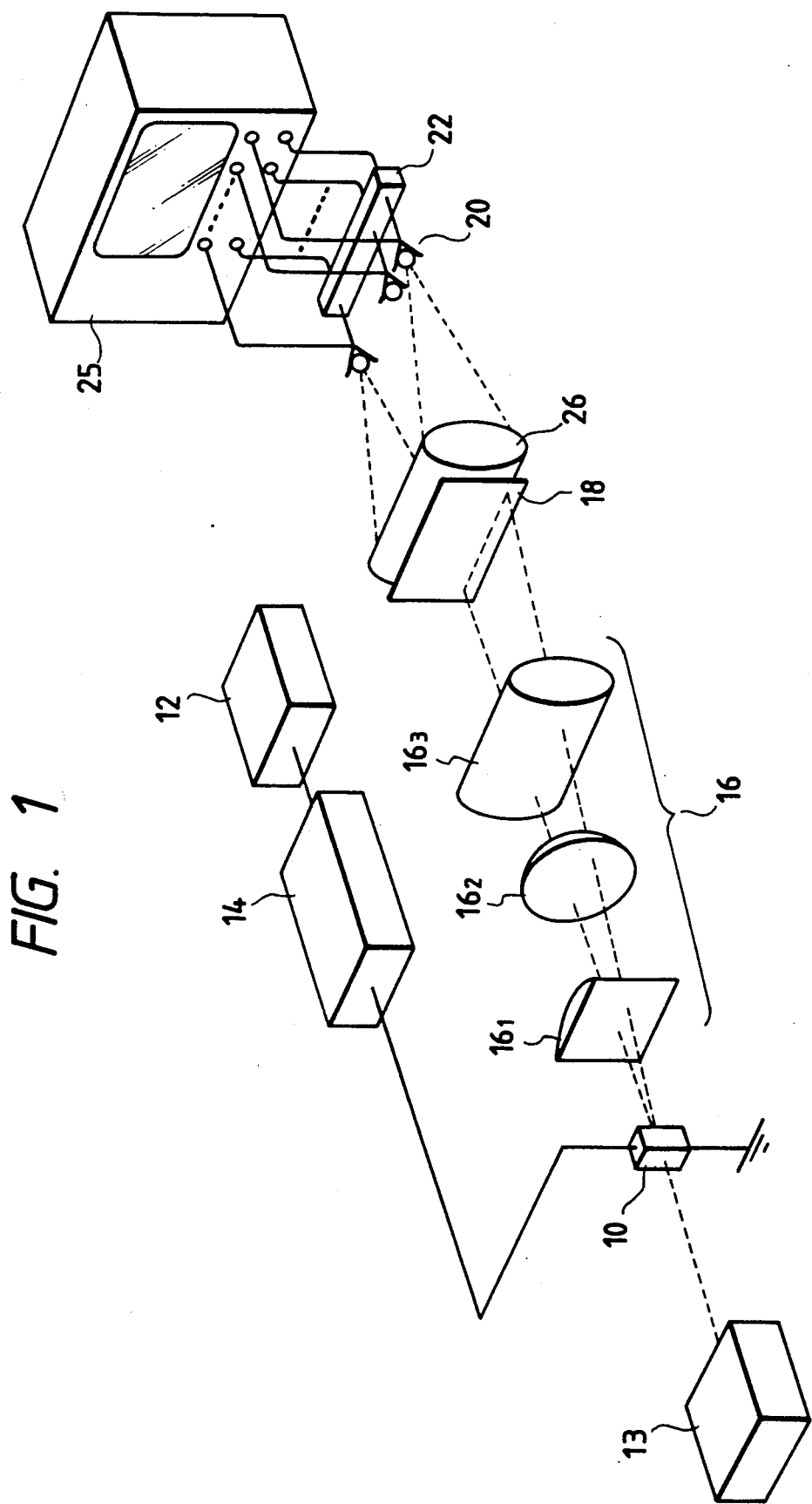
FIG. 1 shows a schematic diagram of a TMTL A/D converter according to an embodiment of the present invention.

The optical analog-to-digital conversion system, for example a TMTL based A/D conversion system, of the present invention comprises input signal source means for providing an input voltage signal having an analog value. Referring to FIG. 1, the input signal source means, as embodied herein, comprises a voltage signal source 12 that provides an analog input signal having a voltage $V_m$ to be digitally converted. A light source means is provided for generating an optical beam. As embodied herein, the light source means comprises a one-dimensional input laser 13 (or optical), which has been spatially filtered.

The optical beam is focused onto acousto-optic (A/D) deflector means, coupled to the input signal source means and the light source means, for deflecting the optical beam at an angle corresponding to the analog value of the input voltage signal. Acousto-optic (A/D) deflector means may comprise an A-O deflector RF driver 14, which is connected to voltage signal source 12, and generates an RF signal of a FM type, which represents a linear conversion of the input voltage signal from voltage signal source 12 into a frequency function. The RF driver 14, as embodied herein, may include a voltage controlled frequency oscillator and an RF amplifier. The RF signal generated by RF driver 14 modulates the deflection of the input laser beam or optical beam from A-O deflector 10 in the Bragg's regime. The voltage ($V_m$) controlled deflected angle ($\theta$) is $$\Theta(V_m) = C \frac{\lambda}{\nu_A} V_m \quad 0 \leq V_m \leq \frac{\Delta F}{C} \quad (1)$$

where C, in an ideal situation, is a constant, and where $\lambda$, $\nu_A$ and $\Delta F$ are the optical wavelength, the acoustic wave velocity and the bandwidth of the cell of A-O deflector 10, respectively.

The optical TMTL based conversion system, according to the present invention, further comprises an analog-to-digital conversion mask means, coupled to the acousto-optic deflector means, for converting the deflected optical beam into N masked optical signals where N is an integer greater than 1 and represents a number of bits of a digital value corresponding to the analog value. As embodied herein, the analog-to-digital conversion mask means comprises an anamorphic optical system 16 and a binary A/D conversion mask 18.

The deflected optical beam passes through the anamorphic optical system 16, which horizontally (or vertically) images (or focuses) the optical beam onto binary A/D conversion mask 18. The anamorphic optical system 16 may include cylindrical lenses $16_1$, and $16_3$, and a lens $16_2$.

For a rectangular beam aperture $L_s \times L_y$ at the cell of A-O deflector 10 coupled with anamorphic optical system 16, the deflected optical signal $U_M(x,y)$ at A/D mask 18 is:

$$U_M(x,y) = rect\left(\frac{x}{\alpha L_x}\right) F\left[rect\left(\frac{x}{L_y}\right) \exp\left[j2\pi \frac{\sin(\Theta)}{\lambda} y\right]\right] \quad (2)$$

$$= rect\left(\frac{x}{\alpha L_x}\right) sinc\left[\frac{L_x}{\lambda f}\left(y - \frac{C f \lambda V_m}{\nu_A}\right)\right]$$

where F[] denotes a spatial Fourier transform, and where $\alpha$ and f are a magnification constant and the focal length of the Fourier transform lens, respectively.

Figure 2:
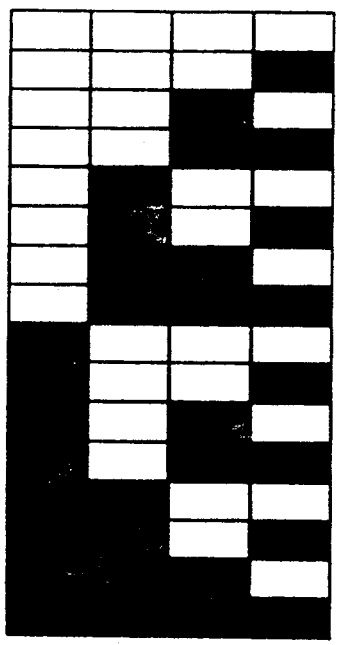
FIG. 2 shows exemplary mask arrays for binary and Gray codes of the A/D conversion mask of FIG. 1.
Figure 2:
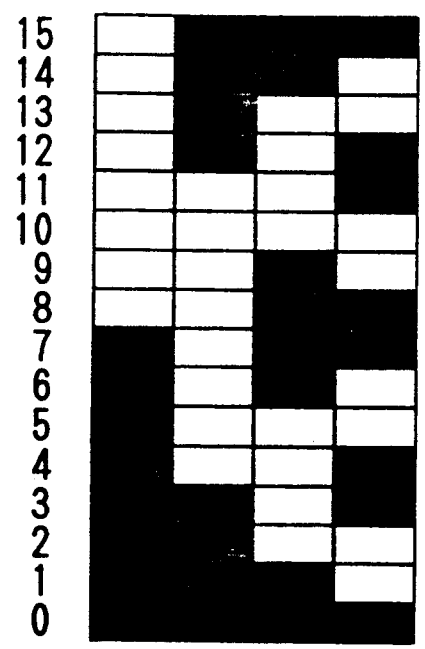

The A/D conversion mask 18, as embodied herein, has a two-dimensional (2D) rectangular array of $N \times 2^N$ pixels (or N columns and $2^N$ rows), i.e.:

$$M_{nm}(x,y) = a_{mn} \delta(x-nd_x, y-md_y) * rect[x/d_x, y/d_y] \quad (3)$$

where * denotes a convolution; where $n = 0 \ldots N-1$; $m = 0 \ldots 2^N - 1$; and where $d_x$ and $d_y$ are the pixel aperture sizes, and $a_{mn}$ is the $mn^{th}$ binary coefficient of the code to be converted into. Since A/D conversion mask 18, as embodied herein, contains N columns, an N-bit A/D conversion precision is obtained. For example, FIG. 2 shows rectangular arrays of 4 (N=4) columns and 16 ($2^N$) rows for binary and gray code outputs.

Along each column of the array of the A/D conversion mask 18, the masked optical signal is spatially integrated and the integrated signal is provided to detection means, coupled to the analog-to-digital conversion mask means, for detecting the N masked optical signals and converting each detected N masked optical signal into an output voltage signal corresponding to a respective bit of the digital value. As embodied herein, the detection means comprises an N-channel photodetector array 20. The integrated signal is provided to a respective one of N photodetectors, of the N-channel photodetector array 20.

At the $n^{th}$ ($n \leq N$) photodetector, the detected optical signal $I_n$ is:

$$I_n = \left| \sum_{m=0}^{2^N-1} M_{mn}(x,y) U_M(x,y) \right|^2 \quad (4)$$

Each detected signal from photodetector array 20 passes through a respective one of a plurality of comparators of a comparator array 22 and is converted to an output voltage signal. Therefore, comparator array 22 generates N-bit A/D converted signals. FIG. 1 shows the connection of an oscilloscope 25 to the output of the comparator array to display the output of the comparator 22.

Figures 3A, 3B, 3C, 3D, 3E, 3F:
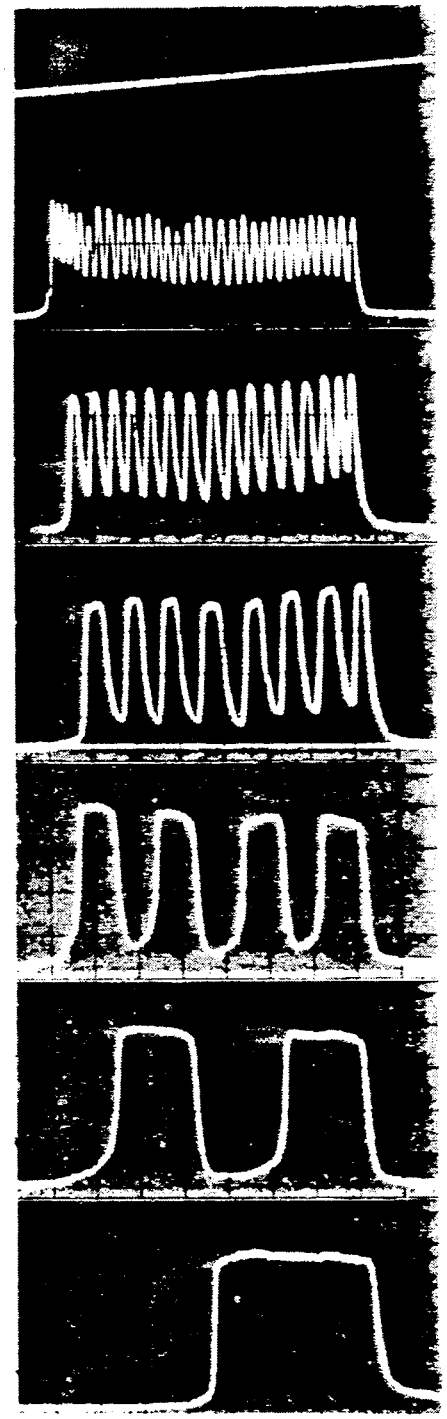
FIGS. 3(A)-3(F) shows an analog input signal diagram, and an output signal diagram representing a respective output bit of a 6-bit A/D converter according to FIG. 1.
Figure 4A:
FIGS. 4(a) through 4(d) show output signals of a 6-bit A/D converter according to FIG. 1 for each pair of exemplary analog-input and binary output.
Figure 4B:
Figure 4C:
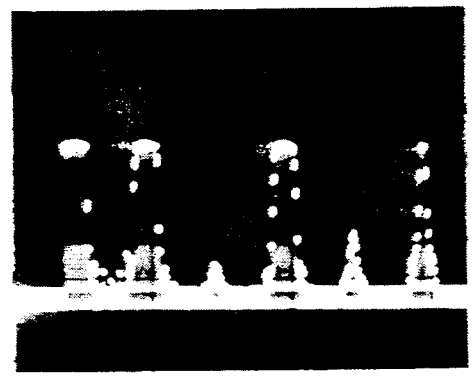
Figure 4D:
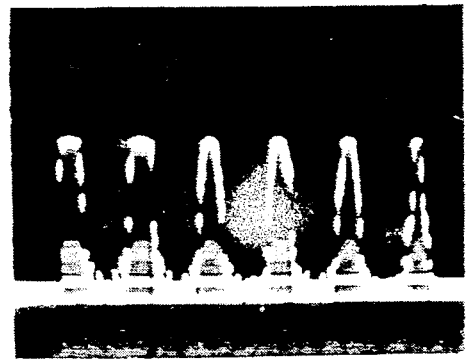

If the light passes through the A/D conversion mask 18 (6-bit binary code pattern) while being scanned upward, the photodetectors 20 produce respective output signals as shown in FIG. 3. As seen in the top part of FIG. 3, the difference between the on and off levels becomes small in the case of the lowest bit. The well-separated signals having 1 and 0 levels as shown in FIG. 4 can be obtained by comparing the output signals of the photodetector array 20 with the reference value.

To ensure a low error rate detection, RF driver 14, as embodied herein, may optionally include an electronic sample-and-hold circuit therein, or, in the alternative, a pulsed laser can be used as a sampler to the cell of A-O deflector 10. To prevent the deflected beam from A-O deflector 10 from scanning multiple rows of the A/D conversion mask 18, the pixel width along the deflection direction should be greater than the main lobe width of the focused band-limited optical beam.

Since the detecting rate of the photodetector 20 is inversely proportional to the size of its area, A/D conversion mask 18, as embodied herein, may optionally include a cylindrical lens 26 to spatially integrate the masked optical signal along the column direction of A/D conversion mask 18.

One key advantage of the optical analog-to-digital conversion system of the present invention is conversion flexibility. For example, unlike the E-O interference-based A/D converter which requires analog input signals to be converted into binary gray codes, the optical TMTL A/D converter of the present invention can convert into any digital code. This advantage is significant because for various computation applications, various digital codes including weighted codes (such as binary, binary-coded decimal, 2421, 6423, etc.) and non-weighted codes (such as cyclic, gray, excess-3, etc.) are often required. In the TMTL-based optical analog-to-digital conversion system of the present invention, to make a particular code change, it is sufficient only to change a precomputed mask array $M_{mn}(x, y)$ (i.e., equation (3) of A/D conversion mask 18) without modifying the remaining optical elements. For example, FIG. 2 shows an exemplary mask array having four columns, b0, b1, b2 and b3, and sixteen rows, 0-15, for binary, four columns, g0, g1, g2 and g3, and sixteen rows, 0-15, for gray code output.

Yet another advantage of the TMTL-based analog-to-digital conversion system of the present invention is the use of the A-O deflector 10. Since the A-O deflector 10 is proven technology, a reliable converter can be constructed therewith. As compared to E-O waveguide devices, A-O deflectors provide a larger dynamic range, a larger time-bandwidth product, and are easier to operate and less expensive to implement. The E-O waveguide based A/D converter has further limitations. For example, to process each additional bit with an E-O waveguide based converter a pair of electrodes having lengths that are double the length of, the present, the longest electrode must be added. The use of long electrodes may cause problems such as nonuniform modulation of electrodes, limiting the precision of the conversion.

The conversion precision of the A-O deflector-based TMTL A/D converter primarily depends on the time-bandwidth product (TBP) of the A-O deflector's. For example, to generate an error-free A/D conversion mask, a diffraction-related restriction on the minimum pixel size $d_y$ needs to be set, i.e.:

$$d_y \geq \Delta y = \frac{2f\lambda}{L_y} \quad (5)$$

where f, $\lambda$ and $L_y$ are the lens focal length, the optical wavelength, and the vertical mask length, respectively. Thus, the maximum number of useful pixels is M, where:

$$M \leq \frac{f\lambda\Delta F}{v_A d_y} = \frac{\tau \Delta F}{2} \quad (6)$$

where $\Delta F$ and $\tau$ are the A-O bandwidth and the acoustic wave aperture time, respectively. Thus, the useful pixels for the A-O TMTL-based analog-to-digital conversion system of the present invention is half of the maximum number of A-O cell's resolvable points determined by its TBP.

Since the number of converted bits is $N=\log_2 M$, the A-O deflector TMTL-based system of the present invention yields higher conversion precision than can be expected from conventional E-O and A/D converters. It has been shown that when a $TeO_2$ A-O cell is used in a slow shear wave mode, a TBP of 2000 (40 MHz bandwidth and 50 $\mu$s aperture time) is obtainable, which in turn provides about a 10-bit A/D conversion precision. For most A-O materials with a TBP of about 1000, the implementation of a 100 MHz 8-bit A-O deflector TMTL-based system is feasible.

Yet another advantage of the TMTL A/D converter of the present invention is that it allows for calibration to compensate for device nonlinearity. The source of such a nonlinearity may come from Bragg's cell, or its driver, or both. As a result of fluctuations of the coefficient C in Eq.(1) as a function of $V_m$, the deflection angle $\theta(V_m)$ becomes a nonlinear function of input voltage. This parametric nonlinearity can be calibrated by using nonuniform pixel size along the mask's vertical (or column) direction. In this case, the same low A/D conversion error rate is achievable at the expense of wasting the device TBP. It can be shown that at the presence of nonlinearity the maximum number of convertible bits is:

$$N' \leq \log_2 \left| \frac{\Delta F L_y |(d\theta/dV_m)|_{min}}{2\lambda C(V_o)} \right| \leq N \quad (7)$$

where $|d\theta/dV_m|_{min} > 0$ and $V_o$ is the voltage corresponding to the maximum deflection angle.

The A-O deflector 10 of the TMTL-based analog-to-digital conversion system, as embodied herein, may include a GaP A-O deflector (Brimrose DF-30) which has a 200 MHz bandwidth centered at 650 MHz. The GaP A-O deflector is coated for a maximum transmittance at $\lambda=633$ nm. The diffraction efficiency and Bragg's angle are 40% at 1 W and 1.7°, respectively. Although a much higher A/D sample rate, which is equal to the A-O cell's repetition rate (e.g., 10 MHz), is achievable, the GaP A-O deflector is operated at a rate of 5 KHz for the ease of detection with a 30 mW CW HeNe laser.

A/D conversion mask 18, as embodied herein, may include a 6-bit laser printer printed mask that has been linearly demagnified 15 times to an approximate size of $9 \times 10$ mm$^2$ and photoprinted onto a chromium plate. Each mask pixel of the mask is about $1500 \times 250$ $\mu$m$^2$. To avoid device nonlinearity, only part of the deflection range is used. To generate this angular scan, a scan of modulated voltages $V_m$ from 0.4 to 28 V can be used.

Referring to FIG. 3, the detected and converted signals from all six (or N=6) A/D converter channels are displayed from the lowest bit to the highest bit. This A-O deflector TMTL-based analog-to-digital conversion system can provide each detected signal simultaneously in parallel in response to a fixed analog voltage signal.

FIGS. 4(a) through 4(d) show binary results 001010, 101010, 110101, and 111111 of A/D conversion of input analog signals of 0.8 V, 20 V, 2.4 V, and 2.8 V, respectively. Error spikes appearing in the figures are due to cross-talk which can be minimized by using high quality optics and masks.

The TMTL-based analog-to-digital conversion system of the present invention is simple in construction and the free space beam steering capability of the A-O deflector is fully utilized. Application of the system of the present invention can be further extended in conjunction with electro-optic and all-optic beam deflectors. An added advantage is the system's unique error correction capability. The system of the present invention can find applications where analog signals need to be processed digitally, e.g., optical sensing, digital signal and data processing, and optical computing.

Other embodiments of the invention will be apparent to those skilled in the art from consideration of the specification and practice of the invention disclosed herein. It is intended that the specification and examples be considered as exemplary only with a true scope and spirit of the invention being indicated by the following claims.

What is claimed is:

1. An architecture of a free space acoustic-optic theta-modulation analog-to-digital conversion system, comprising:

input signal source means for providing an input voltage signal having an analog value;

light source means for generating an optical beam;

acousto-optic deflector means in free space, coupled to the input signal source means and the light source means, for deflecting the optical beam at an angle of deflection corresponding to the analog value of input voltage signal;

anamorphic optical system means in free space for expanding the output light beam of the acousto-optic deflector means in an x-direction and for imaging the output light beam of the acousto-optic deflector means in a y-direction;

a non-uniform analog-to-digital conversion mask means in the anamorphic optical system means, coupled to the acousto-optic deflector means, for converting the deflected optical beam into N masked optical signals where N is an integer greater than "1" and where N represents a number of bits of a digital value corresponding to the analog value; and line photodetector array means positioned in the x-direction, coupled to the analog-to-digital conversion mask means, for detecting the N masked optical signals and for converting each detected N masked optical signal into an output voltage signal corresponding to a respective bit of the digital value.

2. The system of claim 1, wherein said anamorphic optical system means includes a lens combination and a cylindrical lens for expanding the deflected beam in the x-direction and for imaging the deflected beam in the y-direction onto the line photodetector array means.

3. The system of claim 1, wherein said angle of deflection of the optical beam is a nonlinear function of said input signal source.

4. The system of claim 1, wherein said non-uniform analog-to-digital conversion mask means includes an array of pixels of uniform size in each row and of non-uniform size in each column to compensate for the nonlinear relationship of the input voltage signal and the deflecting angle.

5. The system of claim 2 wherein the non-uniform analog-to-digital conversion mask means is placed immediately before the cylindrical lens.

* * * * *